May 17, 1966 A. A. VALDETTARO 3,251,234

VHF-UHF TELEVISION TUNER

Filed Jan. 31, 1964 4 Sheets-Sheet 1

INVENTOR by Mason, Kolehmainen, Rathburn and Wyss.

ATTORNEYS.

INVENTOR.

by

Mason, Kolehmainen, Rathburn and Wyss.
ATTORNEYS.

May 17, 1966 A. A. VALDETTARO 3,251,234

VHF-UHF TELEVISION TUNER

Filed Jan. 31, 1964 4 Sheets-Sheet 3

INVENTOR by Mason, Kolehmainen, Rathburn and Wyss

ATTORNEYS.

May 17, 1966 A. A. VALDETTARO 3,251,234

VHF-UHF TELEVISION TUNER

Filed Jan. 31, 1964 4 Sheets-Sheet 4

INVENTOR by Mason, Kolehmainen, Rathburn and Wyss.
ATTORNEYS 3,251,234

VHF-UHF TELEVISION TUNER

Alarico A. Valdettaro, Bloomington, Ind., assignor to Sarkes Tarzian, Inc., Bloomington, Ind., a corporation of Indiana Filed Jan. 31, 1964, Ser. No. 341,612
18 Claims. (Cl. 74—10.5)

The present invention relates to television tuners, and, more particularly, to television tuners which are capable of receiving signals from television channels in either the VHF television band or the UHF television band. Specifically, the present invention is directed to a new and improved drive mechanism for actuating the controls of both the VHF and UHF tuner portions of a combined VHF-UHF tuner unit.

Many arrangements have been heretofore proposed for receiving both VHF and UHF signals. Furthermore, certain of these arrangements have employed the VHF fine tuning shaft as a UHF station selector control. One such arrangement is shown in Meadows et. al., Patent No. 2,824,957, assigned to the same assignee as the present invention, wherein the combined VHF fine tuning and UHF station selecting shaft is provided with a two-speed arrangement which permits rapid selection of UHF stations together with a vernier action to permit precise or fine tuning of the selected UHF station. While this prior art arrangement is in general suitable for its intended purpose, the mechanism employed to drive the UHF tuning shaft is quite complicated and requires both VHF and UHF tuners which are specifically adapted for the VHF-UHF combination. In many instances it would be desirable to provide a standard VHF tuning unit and a standard UHF tuning unit and to provide further a drive unit whereby both of these standard units may be assembled in a combination VHF-UHF unit without requiring special adaptation of the VHF and UHF tuner units themselves. Accordingly, it is an important object of the present invention to provide a new and improved drive mechanism whereby a standard VHF tuner unit and a standard UHF tuner unit may be interconnected so that both tuners may be driven by a total of only two control knobs.

It is another object of the present invention to provide a new and improved VHF-UHF combination tuner unit wherein the fine tuning knob of the unit performs the functions of VHF fine tuning, UHF fine tuning and UHF coarse tuning in a simple, economical and reliable manner.

It is still another object of the present invention to provide a new and improved VHF-UHF tuner combination unit wherein a single control knob of the unit acts as a VHF fine tuning knob, a fine and coarse UHF tuning knob and facilities are provided for producing an audible indication when the limit of travel of the UHF main tuner shaft is reached while at the same time providing a slip clutch so that damage to the drive unit is avoided.

A still further object of the present invention resides in the provision of a new and improved VHF-UHF combination tuner unit wherein the parts of the drive mechanism may be readily assembled and disassembled on VHF and UHF tuners of standardized construction.

The invention, both as to its organization and method of operation, together with further objects and advantages thereof, will best be understood by reference to the following specification taken in connection with the accompanying drawings, in which.

Figures 3, 4, 5:
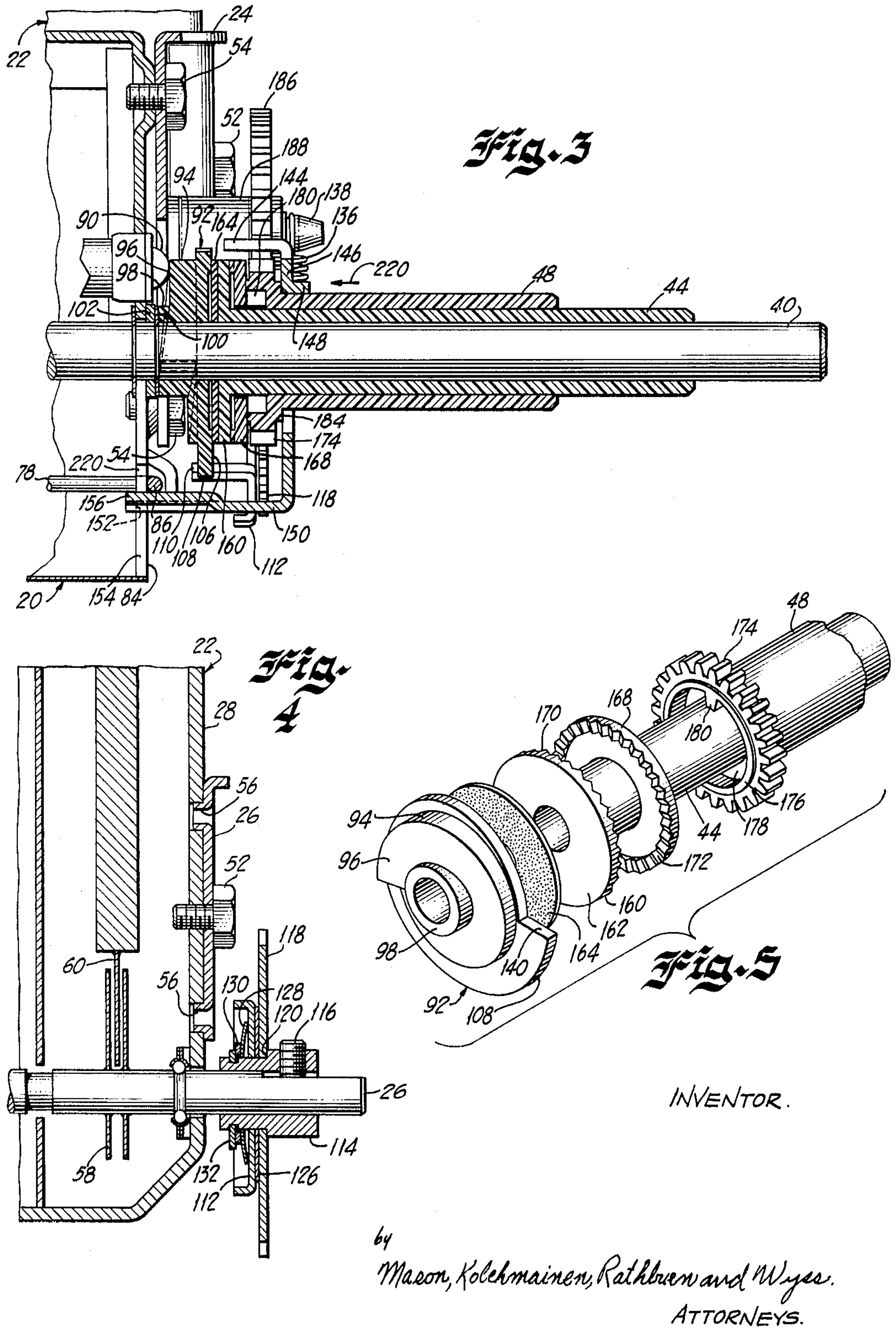
FIG. 3 is a sectional view taken along the lines 3—3 of FIG. 2.
FIG. 4 is a sectional view taken along the lines of 4—4 of FIG. 2.
FIG. 5 is an exploded view of certain parts of the drive mechanism of FIG. 1.

Referring now to the drawings, the combined VHF-VHF tuning arrangement of the present invention is therein illustrated as comprising a VHF tuning unit indicated generally at 20 and a UHF tuning unit indicated generally at 22. The units 20 and 22 are arranged to be mounted in side-by-side relation by means of a bracket indicated generally at 24 which joins the forward ends of these units. Another bracket (not shown) is employed mechanically to connect the rear ends of the units 20 and 22 so that they are arranged in side-by-side relationship. The main tuning shaft 26 of the UHF tuner unit extends through one end wall 28 of the unit 22 and the electrical components within the unit 22 are accessible for service and repair by means of a removable cover 30 which closes one vertical side of the unit 22. The VHF tuner unit 20 is provided with a station selector shaft 40 to the end of which there is secured a station selector knob 42. A multi-purpose control shaft 44 is rotatably positioned on the station selector shaft 40 and a control knob 46 is connected to the end of the shaft 44. Manipulation of the knob 46 effects VHF fine tuning, UHF coarse tuning, or station selection, and UHF fine tuning, as will be described in more detail hereinafter. A hollow indicator sleeve 48 is rotatably mounted on the shaft 44 and a suitable indicator dial 50 is secured to the end of the sleeve 48. The dial 50 is arranged to be viewed through a suitable opening in the cabinet (not shown) of the associated television receiver. The bracket 24 is secured to the UHF tuning unit 22 by means of the bolt 52 and to the VHF tuning unit 20 by means of the bolts 54 so that these units are rigidly mounted together. The bracket 24 is also provided with a pair of inwardly extending flanges 56 (FIG. 4) which enter suitable openings in the end wall 28 of the UHF tuner portion 22 so that this tuner portion is accurately oriented with respect to the VHF tuner portion 20.

Figures 1, 2:
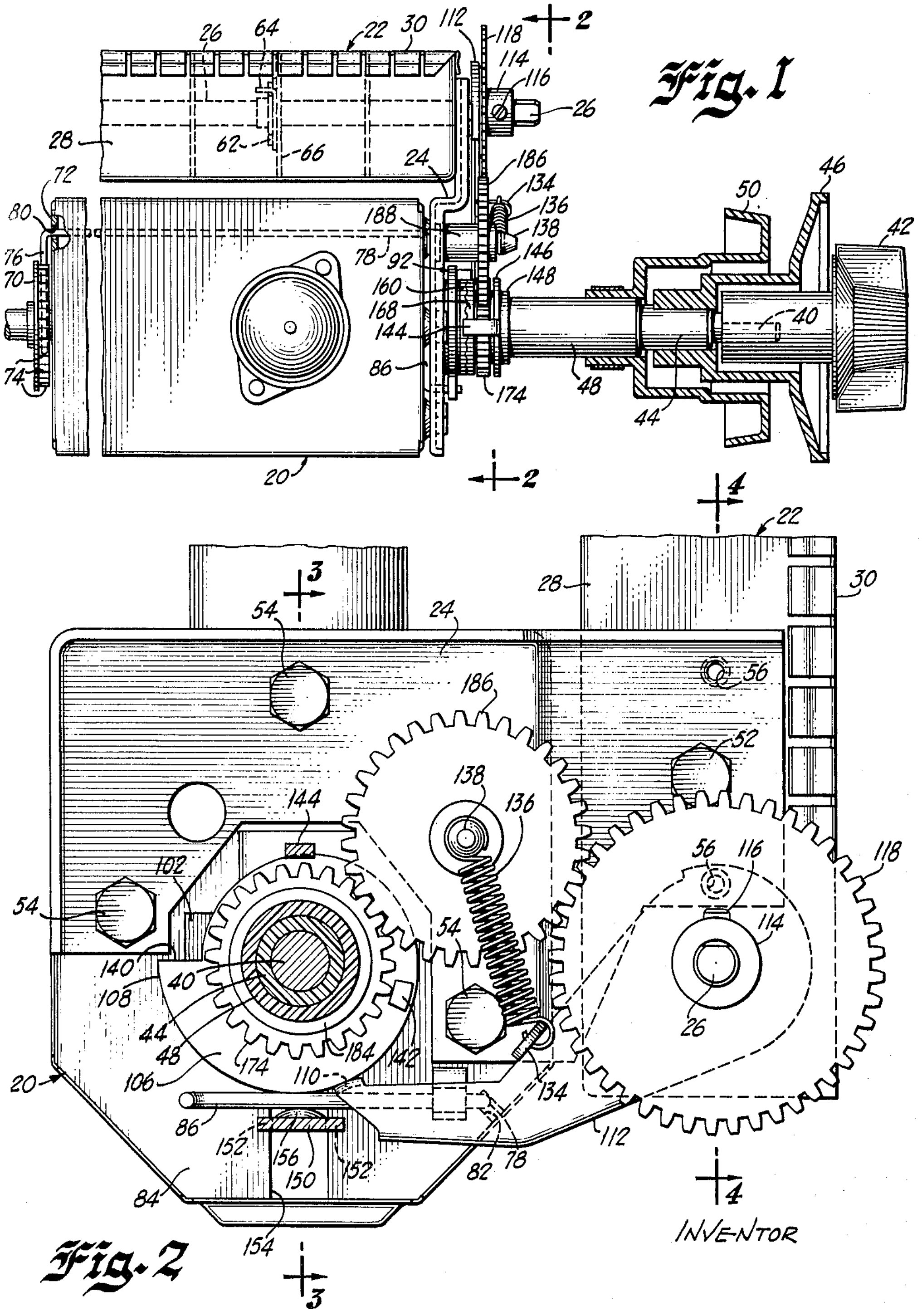
FIG. 1 is a top view of a combined VHF-UHF tuner combination unit embodying the features of the present invention.
FIG. 2 is a sectional right side view taken along the lines 2—2 of FIG. 1.

The UHF tuner unit 22 may comprise any suitable electronic circuitry which is capable of receiving a selected one of the UHF television stations and converting the received signal into a corresponding intermediate frequency signal of suitable characteristics for further processing either in the VHF tuner portion 20 or in the TV receiver proper, as will be readily understood by those skilled in the art. Thus, for example, a plurality of tuning elements such as the elements 58 shown in FIG. 4, may be secured along the length of the main tuning shaft 26 of the UHF tuning unit 22 and cooperates with fixed tuning elements 60 to provide the required selectivity for proper reception of any desired UHF signal. The UHF main tuning shaft 26 is provided with an arcuate plate 62 (FIG. 1) which is rigidly secured to the shaft 26 and is adapted to engage a side turned lug 64 secured to an intermediate bracket 66 of the UHF tuner unit 22 so as to provide a positive stop arrangement which limits the rotation of the main tuning shaft 26 to approximately 180°.

The combined VHF-UHF drive mechanism of the present invention is arranged to cooperate with the main tuning shaft 26 in such manner that when the multi-purpose control knob 46 is manipulated during UHF reception to select a desired UHF station, a detent action is produced on the control knob 46 when the stop 64 is reached to indicate to the user that the upper or lower limit of UHF stations has been reached. However, if the user continues to force the control knob 46 in the same direction a slip clutch arrangement is provided so that the UHF tuner unit 22 and the drive mechanism itself is not damaged while, at the same time, an audible clicking noise is produced to inform the user that the UHF tuning limit has been reached, as will be described in more detail hereinafter.

Considering now the general arrangement of the VHF tuning unit 20, a flat disc 70 is secured to the rear end of the station selector shaft 40 beyond the rear end wall 72 of the VHF tuner chassis. The disc 70 is provided with a plurality of undercut ridges or teeth 74 which cooperate with the right-angle end portion 76 of a torsion bar spring 78 which extends along the length of the VHF tuner unit 20 and is positioned in the notch 80 in the rear end wall 72 of the tuner and in the notch 82 in the front end wall 84 of the tuner unit 20. The free end of the right angle portion 76 of the torsion spring 78 seats between the teeth 74 so as to provide a positive detent action for the station selector shaft 40 corresponding to the station selecting positions of this shaft. Also, the upward bias of the end portion 76 of the torsion spring 78 forces the rear end of the selector shaft 40 upwardly into a pair of V-shaped bearing surfaces provided in the end wall 72 of the VHF tuner unit 20 (not shown) so that the rear end of the shaft 40 is accurately located. A torsion spring arrangement of similar construction is shown and described in a Valdettaro et al. application Serial No. 63,-889, filed October 20, 1960, and assigned to the same assignee as the present invention and reference may be had to this copending application for a detailed description thereof. However, in accordance with the present invention, the other right angle end portion 86 of the torsion bar spring 78 performs additional functions in connection with the combined VHF-UHF drive mechanism of the present invention whereby a simple and economical drive mechanism is provided which may be readily assembled and disassembled, as will be described in more detail hereinafter.

The electrical circuitry of the VHF tuner 20 may comprise any suitable arrangement for selectively receiving any one of the 12 VHF television channels and for converting the selected signal into a suitable intermediate frequency signal which may be further amplified in the television receiver proper. The VHF tuner unit 20 is provided with a VHF fine tuning element in the form of a spring biased plunger 90 which may be moved along an axis parallel to the selector shaft 40 to provide fine tuning operation of the local oscillator in the VHF unit 20. The plunger 90 may actuate either a capacitive or an inductive fine tuning unit, insofar as the present invention is concerned it being necessary only that the desired change in capacitance or inductance be effected in response to axial movement of the plunger 90.

Considering now in more detail the combined VHF-UHF drive mechanism of the present invention, a dual purpose cam member indicated generally at 92 is rotatably mounted on the station selector shaft 40 and is provided with a hub portion 94 which has a first cam surface 96 formed in the rear end surface thereof which is adapted to be engaged by the rounded end portion of the plunger 90. The cam member 92 is also provided with a rearwardly extending boss portion 98 of small diameter which is adapted to seat on a spring washer 100 which fits within a groove in the station selector shaft 40 so as to hold the shaft in an assembled position on a cross-bar member 102. The member 102 is provided with inwardly extending stud portions 103 which register in suitable openings in the front wall 84 of the VHF tuner 20 and the member 102 is provided with an octagonally shaped opening having a pair of opposed sloping shoulders 104 against which the forward end of the shaft 40 is urged by the right angle end portion 86 of the torsion spring 78, thereby accurately positioning the front end of the station selector shaft 40. When the cam member 92 is urged rearwardly so that the boss portion 98 thereof engages the washer 100, the cam surface 96 is spaced properly to move the VHF fine tuning plunger 90 through the desired range of movement to effect the desired change in local oscillator frequency during the VHF fine tuning operation.

In order to utilize the same cam member 92 for both VHF fine tuning and fine and coarse UHF tuning, the cam member 92 is provided with a radially extending flange portion 106, the periphery 108 of which forms a second cam surface in a direction at right angles to the cam surface 96. The cam surface 108 is adapted to be engaged by an offset tongue 110 formed in the end of a cam follower arm 112. The cam follower arm 112 is connected to the main tuning shaft 26 of the UHF tuning unit 22 through a slip clutch arrangement so that for UHF fine tuning, the main tuning shaft 26 is rotated slightly as the cam follower 112 follows the cam surface 108 during the UHF fine tuning operation. More particularly, a mounting sleeve 114 is secured to the end of the UHF main tuning shaft 26 by means of the set screw 116 and a spur gear 118 is seated on a shoulder 120 formed in the sleeve 114. The sleeve 114 is provided with keyways 122 (FIG. 6) which cooperate with the keys 124 formed in the central opening of the gear 118 so that this gear is directly connected to the sleeve 114 and hence to the main tuning shaft 26. A flat washer 126 is positioned between the face of the gear 118 and the hub portion of the cam follower arm 112 on the sleeve 114. The cam follower arm 112 is pressed against the washer 126 by means of a spring washer 128 which is positioned beneath a flat washer 130 and is retained by a C-washer 132 so that the cam follower arm is effective to rotate the main tuning shaft 26 as the tongue portion 110 thereof follows the cam surface 108. It will be evident that the UHF main tuning shaft is thus driven at an extremely reduced rate since substantially one revolution of the cam member 92 moves the end of the cam follower arm 112 only from the position shown in FIG. 8 to the position shown in FIG. 10 so that an extremely precise fine tuning of the UHF main tuning shaft 26 is provided. However, when the main tuning shaft 26 is to be driven at a substantially increased rate through the gear 118, the plate 126 acts as a clutch which permits slippage between the gear 118 and the cam follower 112 so that the shaft 26 can be rotated at a relatively high rate to provide rapid selection of the desired portion of the UHF television band. The cam follower arm 112 is provided with an offturned lug 134 and a spring 136 is connected between the lug 134 and a stud 138 which is mounted in the bracket 24 so that the tongue 110 is continuously biased against the cam surface 108.

Figure 8:
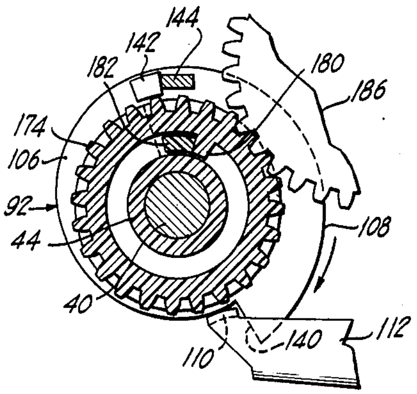

In order to limit rotation of the cam member 92 so that the tongue portion 110 of the cam follower 112 will not be jammed against the end face 140 of the cam surface 108, the cam member 92 is provided with a forwardly extending lug portion 142 which is adapted to engage a rearwardly turned lug portion 144 on a bracket 146. The bracket 146 is provided with a flanged portion 148 which seats on the indicator sleeve 48 and is also provided with a right angle flange portion 150 provided with notches 152 therein which are adapted to cooperate with the edges of an upwardly extending slot 154 in the front wall 84 of the tuner unit 20 to provide an interlocked connection of these parts. The end portion 86 of the torsion bar spring 78 engages a raised portion 156 in the bracket flange 150 so as to hold the parts of the drive mechanism in assembled relation, as will be described in more detail hereinafter. In this manner the lug 144 of the bracket 146 provides a positive stop which can be engaged by the lug portion 142 of the cam member 92 and provides limits of travel of the cam member 92. In FIG. 8 the lug portion 142 is shown in engagement with one side of the lug 144 when the cam follower 112 is positioned in engagement with the minimum radius of the cam surface 108 and in FIG. 10 the lug portion 142 is shown in engagement with the other side of the lug 144 when the cam follower 112 rides on the largest radius of the cam surface 108.

It will thus be seen from the foregoing description that the single cam member 92 provides fine tuning of both the VHF fine tuning element 90 and the UHF main tuning shaft 26 of the UHF tuning unit 22 during somewhat less than one full revolution of the multi-purpose knob 46. In this connection it will be understood that suitable switching circuits are provided within the tuner units 20 and 22 so that reception may be shifted from VHF to UHF television signals as desired. For example, the VHF station selector shaft 40 may be provided with a 13th position in which position the UHF tuner unit is energized to receive UHF signals and the IF output of this tuner is supplied to the VHF tuner 20 which is then operated as an IF amplifier during UHF reception. However, during either VHF reception or UHF reception, the cam member 92 is effective to provide the above described fine tuning actions.

Considering now the manner in which the cam member 92 is actuated from the multi-purpose knob 46, the fine tuning shaft 44 is provided with a transveres disc 160 on the end thereof, the disc 160 being provided with a smooth end surface 162 which engages a friction clutch plate 164 position between the end surface 162 and the end surface 166 of the cam member 92. Another transverse disc 168 is positioned on the fine tuning shaft 44, and the outer edges of the opposed surfaces of the discs 160 and 168 are provided with mating teeth 170 and 172, respectively, which normally seat together in the manner shown in FIG. 1 so that the discs 160 and 168 rotate together. The indicator sleeve 48 is provided with a spur gear element 174 which is formed on the end of the sleeve 48 and an annular boss 176 (FIG. 5) is provided adjacent the inner edge of the gear element 174 which boss rides on the adjacent surface of the disc 168. The sleeve 48 is provided with an annular recess 178 in the inner end thereof and radially inwardly extending dog 180 is formed in the sleeve 48 which is adapted to engage a projecting lug 182 on the disc member 168 when the parts are assembled with the boss 176 resting on the end surface of the disc 168. An annular boss 184 is provided adjacent the outer edge of the gear element 174 and so that the boss 184 rides on the bracket 146 as the parts are rotated. The gear element 174 meshes with an intermediate gear 186, the hub portion 188 of which is rotatably mounted on the post 138 and the gear 186 in turn meshes with the gear 118 connected to the UHF main tuning shaft 26.

When the multi-purpose knob 46 is rotated, the disc 160 is pressed against the cam member 92 through the clutch plate 164 by virtue of the pressure exerted thereon by the spring biased bracket 146 so that the cam member 92 rotates with the control knob 46 over the entire fine tuning range for either VHF reception or UHF reception. The lug 182 on the disc 168 and the internal tooth or dog 180 form a lost motion connection which permits the cam member 92 to be rotated substantially one full revolution without connection of the disc 168 to the gear element 174. Thus, as the control knob 46 is rotated one revolution clockwise as viewed from the front of the tuner, the lug 142 on the cam member 92 moves from the position shown in FIG. 10 to the position shown in FIG. 8 and during this rotation the lug 182 on the disc 168 moves from one side of the tooth 180 to the other side of the tooth but does not drive the gear 174 directly. However, during this rotation of the cam member 92 the cam follower 112 does produce a slight movement of the gear 118, which constitutes the UHF fine tuning adjustment of the main tuning shaft 26, and this motion of the gear 118 is translated back through the gear 186 and the gear element 174 so that the tooth 180 does move a slight distance from its position shown in FIG. 10 to the position shown in FIG. 8 during the above described movement of the cam member 92 through its full range of movement. When the position shown in FIG. 8 is reached, the lug 182 engages the tooth 180 and drives the gear 174 directly in a one-to-one ratio with the fine tuning shaft 44. Accordingly, the gear 174 is rotated in the direction of the full line arrow 200 shown in FIG. 9, so that the gear 118 is moved in the direction of the full line arrow 202 to rotate the tuning shaft 26 of the UHF tuning unit 22 at a rapid rate to the desired area on the indicator dial 50 which contains the desired UHF station.

Figures 9, 10, 11:
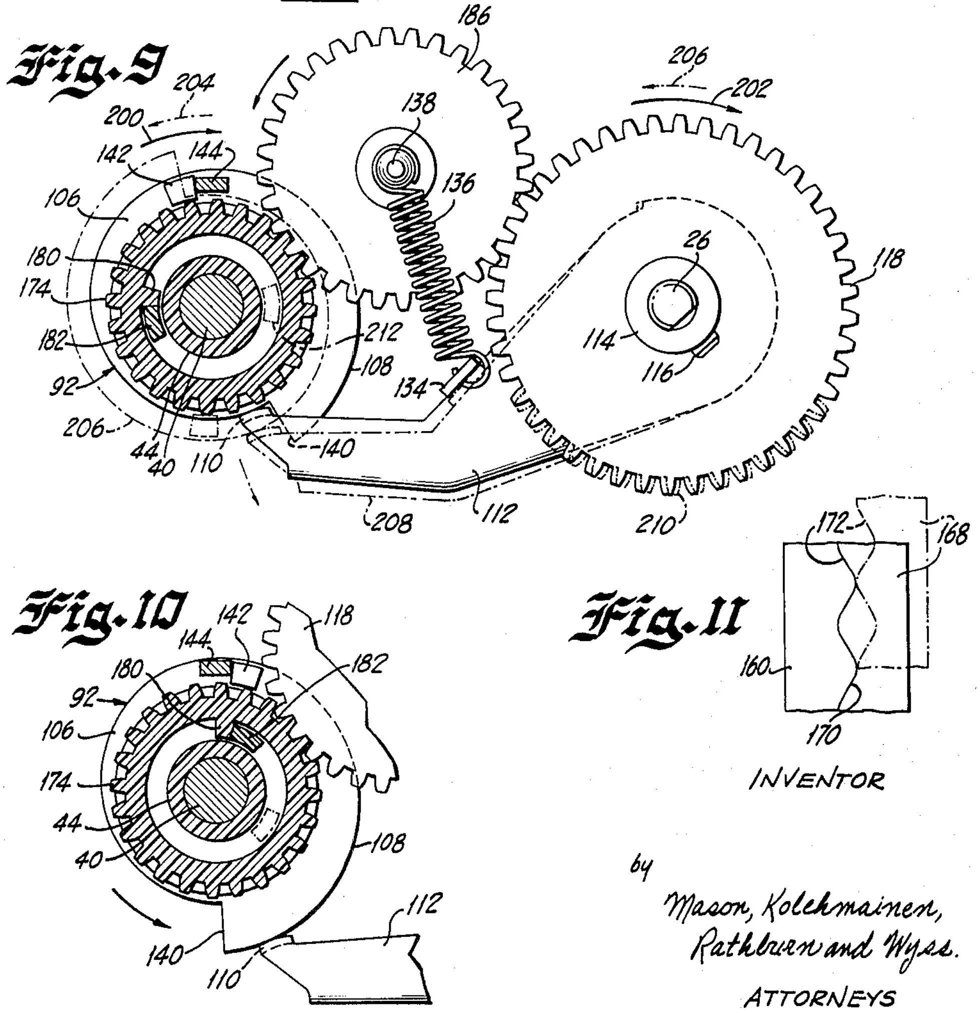
FIG. 11 is a fragmentary view of the slip clutch arrangement employed in the tuner of FIG. 1, shown on an enlarged scale.

In order to provide a precise or fine tuning adjustment of the shaft 26 to the desired UHF station, the knob 46 is then rotated in the opposite direction, as indicated by the dotted line arrow 204 in FIG. 9 which produces rotation of the gear 118 in the direction of the dotted line arrow 206 (FIG. 9) at the above described slow rate due to movement of the cam follower 112 as it engages the edge of the cam member 92. In FIG. 9 the cam member is illustrated as being moved counterclockwise until it occupies the position shown in dotted lines at 206 in FIG. 9 in which position the cam follower 112 will occupy the position 208 and the gear 118 will have been moved to the position shown in dotted lines at 210. During this reverse movement of the knob 46, the lug 182 moves away from the tooth 180 and occupies the position shown in dotted lines at 212, at which position it is assumed that precise adjustment to the desired UHF station has been achieved.

If it is desired to select a UHF station at the other end of the UHF band, the knob 46 is rotated in a counterclockwise direction and the shaft 26 moves at the slow fine tuning rate until the lug 142 engages the righthand edge of the lug 144 at which time the lug 182 picks up the tooth 180 so that the gear 174 is rotated in a counterclockwise direction at the same one-to-one ratio with respect to the knob 46 and the UHF main tuning shaft 26 is moved in a counterclockwise direction at a relatively high rate. In this connection it will be understood that the ratios of the gears 174, 186 and 118 are chosen so that the indicator dial 50 will move throughout its range of channel indication in synchronism with the range of movement of the main tuning shaft 26 so that the channel number of the selected UHF station will appear at the proper point on the indicator dial 50 throughout the range of movement of the shaft 26.

It will be noted that the gear 118 will be driven directly through the gears 174 and 186 when the stop limits provided by the lug 64 for the shaft 26 are reached in either direction. This means that the user can exert a relatively large force on the shaft 26 due to the direct ratio gear arrangement which is utilized. In order to prevent damage to the shaft 26, the tuning elements within the UHF tuner 22 and the drive mechanism itself, and to further provide an audible indication that the limit of travel of the shaft 26 has been reached, there is provided the mating teeth 170, 172 on the opposed faces of the discs 160 and 168. Normally the discs 160 and 168 are pressed tightly together by virtue of the force exerted thereon by the bracket 146 so that these discs rotate together as a unit during both the fine tuning operations and also during coarse UHF tuning. However, when either of the stop limits of the shaft 26 is reached, and the user attempts to force the knob 46 further in the same direction, the discs 160 and 168 are forced apart against the bias of the bracket 146 by an amount sufficient to cause the teeth 170, 172 to ride over each other. Accordingly, upon further rotation of the knob 46 in a direction beyond the stop limit of the shaft 26, the bottom disc 160 slips with respect to the disc 168 so that further excessive torque is not transmitted through the lug 182 and the tooth 180 and through the gear train to the shaft 26. Furthermore, slippage of the disc 160 with respect to the disc 168 produces an audible clicking noise as the teeth 170, 172 slide over each other so that the user is informed that the limit of travel of the shaft 26 has been reached. However, as soon as pressure on the knob 46 is removed, the teeth 170, 172 mate and the discs 160, 168 again rotate as a unit during the succeeding tuning operation in the opposite direction.

Figure 6:
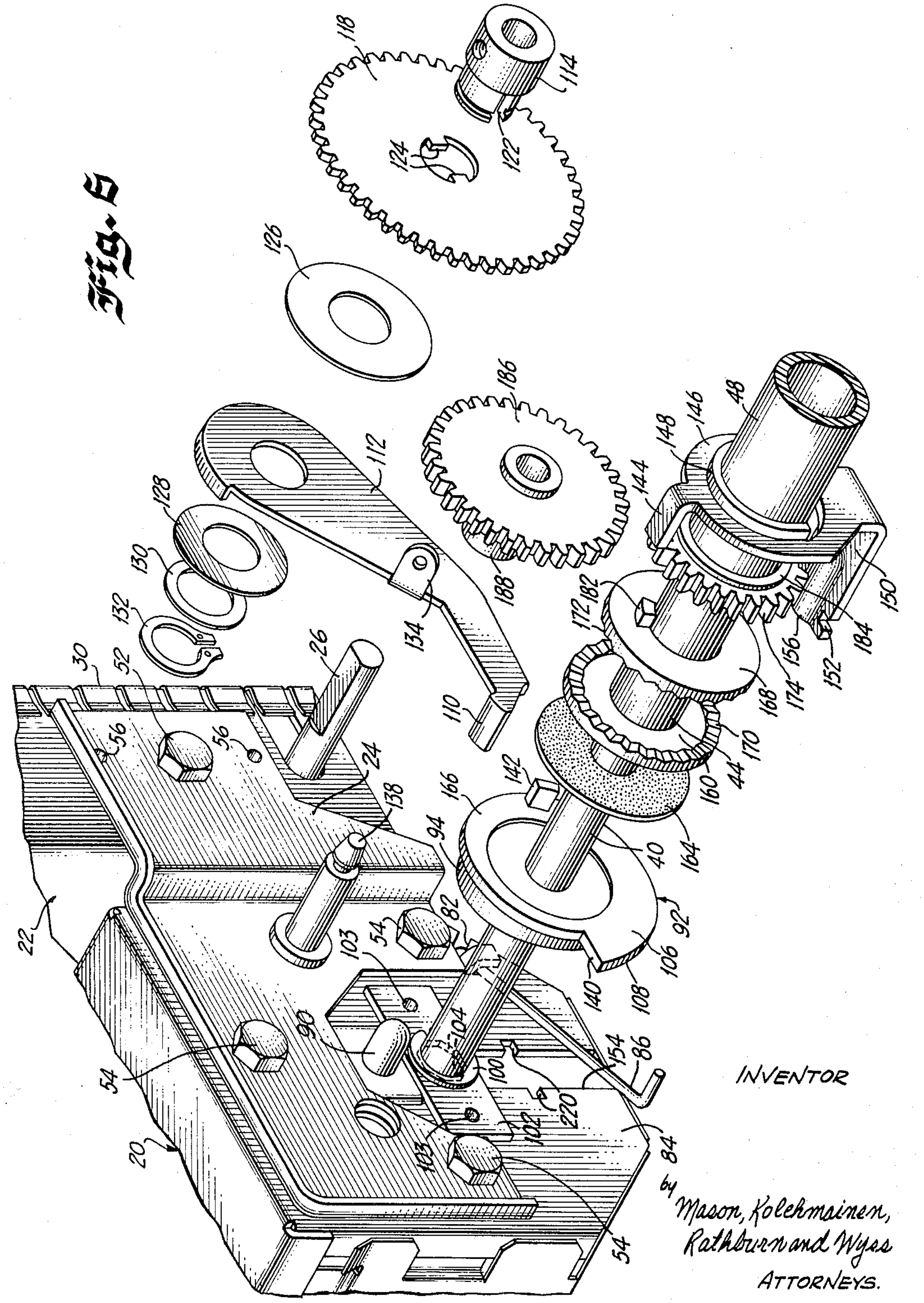
FIG. 6 is an exploded view showing the parts of the drive mechanism of FIG. 1 from a different angle.
Figure 7:
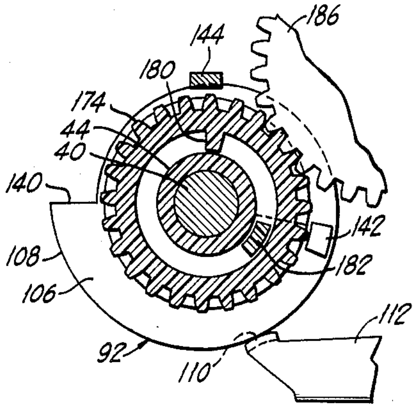
FIGS. 7 to 10 are diagrammatic views illustrating the operation of the drive mechanism of FIG. 1.

It is pointed out that the bracket 146 in cooperation with the end portion 86 of the torsion spring 78, provides a suitable bias pressure to hold all of the parts of the drive mechanism in cooperative relationship and to provide the above described force necessary to permit the above described operations. This biasing force is provided by engagement of the end portion 86 of the torsion spring 78 with the offset flange 150 of the bracket 146. The unbiased position of the end portion 86 is shown in FIG. 6. However, when the parts are assembled on the selector shaft 40 the flange 150 of the bracket 146 is inserted into corresponding notches 220 in the sides of the slot 154 provided in the front wall 84 of the VHF tuner chassis by an amount sufficient that the notches 152 in the flange 150 may be slid along the edges of the slot 154 to provide an interlocked connection. The end portion 86 of the spring 78 engages the portion 156 of the bracket 146 and exerts a downward force on this end of the bracket. This downward force on the end of the bracket 146 exerts a force in the direction of the arrow 220 shown in FIG. 3 on the upper portion of the bracket 146 which pressure is sufficient to hold the parts of the drive mechanism in the assembled relation shown in FIG. 3. Also, the downward force exerted by the end portion 86 of the torsion spring 78 exerts a downward force on the station selector shaft 40 through the bracket 146 and hold this shaft against the V-bearing surfaces 104 in the bar 102. Accordingly, the torsion spring 78 functions to position the shaft 40 accurately with respect to V-bearings at both the front and rear of the tuner chassis, provides the above described detent action through the bias exerted by the rear end 76 of the spring 78 on the detent disc 70 and exerts a pressure on the drive mechanism parts to hold the same in their assembled relation and in such manner that they function properly to provide the above described fine and coarse tuning operations. Also, the bias provided by the spring 78 may be overcome when the limits of travel of the UHF tuning shaft 26 are reached to permit the teeth 170, 172 to slip, as described heretofore. Furthermore, by using the force of the spring arm 86 to hold the drive mechanism parts in assembled relation, the entire drive mechanism may be readily disassembled during the manufacturing operation and disassembled for repair or replacement. Thus, it is only necessary to lift the end portion 86 of the torsion bar 78 upwardly out of engagement with the bottom flange 150 of the bracket 146 by an amount sufficient that the bracket flange 150 may be lifted upwardly into alignment with the slots 220 and thereafter moved outwardly away from the front wall of the tuner so that the assembled parts of the drive mechanism may be removed as desired.

While there has been illustrated and described a single embodiment of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. In a television tuner of the combined VHF-UHF type, a VHF tuner portion having a fine tuning element, a station selector shaft, a multi-purpose shaft concentric with said station selector shaft, a dual function cam member rotatably mounted on said station selector shaft, clutch means connecting said multi-purpose shaft to said cam member to rotate the same, a UHF tuner portion having a main tuning shaft, means responsive to rotation of said cam member for moving said fine tuning element and simultaneously rotating said main tuning shaft at a relatively slow rate, stop means for limiting rotation of said cam member to less than 360°, and means responsive to movement of said multi-purpose shaft after said stop means is reached for driving said main tuning shaft directly at a substantially increased rate.

2. A combined VHF-UHF television tuner comprising, a VHF fine tuning element, a VHF station selector shaft, a fine tuning shaft, a cam member rotatably mounted on said station selector shaft, said cam member having a first cam surface adapted to engage said fine tuning element, clutch means connecting said fine tuning shaft to said cam member to rotate the same for VHF fine tuning, a UHF main tuning shaft, said cam member having a second cam surface, a cam follower arm connected to said main tuning shaft and biased into engagement with said second cam surface on said cam member, whereby rotation of said fine tuning shaft is effective simultaneously to actuate said fine tuning element and to rotate said main tuning shaft at a relatively slow rate, stop means for limiting rotation of said cam member to less than 360°, and means responsive to movement of said fine tuning shaft after said stop means is reached for driving said main tuning shaft directly at a substantially increased rate.

3. A combined VHF-UHF television tuner comprising, a VHF fine tuning element, a VHF station selector shaft, a fine tuning shaft, a cam member rotatably mounted on said station selector shaft, said cam member having a first cam surface adapted to engage said fine tuning element, clutch means connecting said fine tuning shaft to said cam member to rotate the same for VHF fine tuning, a UHF main tuning shaft, said cam member having a second cam surface in a plane at right angles to said first cam surface, a cam follower arm connected to said main tuning shaft and biased into engagement with said second cam surface on said cam member, whereby rotation of said fine tuning shaft is effective simultaneously to actuate said fine tuning element and to rotate said main tuning shaft at a relatively slow rate, stop means for limiting rotation of said cam member to less than 360°, and means responsive to movement of said fine tuning shaft after said stop means is reached for driving said main tuning shaft directly at a substantially increased rate.

4. A combined VHF-UHF television tuner comprising, a VHF fine tuning element, a VHF station selector shaft, a fine tuning shaft, a cam member rotatably mounted on said station selector shaft, said cam member having a first cam surface which varies in a direction parallel to the axis of said fine tuning shaft and is adapted to engage said fine tuning element, clutch means connecting said fine tuning shaft to said cam member to rotate the same for VHF fine tuning, a UHF main tuning shaft, said cam member having a second cam surface which varies in a direction perpendicular to the axis of said fine tuning shaft, a cam follower arm connected to said main tuning shaft and biased into engagement with said second cam surface on said cam member, whereby rotation of said fine tuning shaft is effective simultaneously to actuate said fine tuning element and to rotate said main tuning shaft at a relatively slow rate, stop means for limiting rotation of said cam member to less than 360°, and means responsive to movement of said fine tuning shaft after said stop means is reached for driving said main tuning shaft directly at a substantially increased rate.

5. A combined VHF-UHF television tuner comprising, a VHF fine tuning element, a VHF station selector shaft, a fine tuning shaft, a cam member having a hub portion rotatably mounted on said station selector shaft and provided with a first cam surface on the end of said hub portion which is adapted to engage said fine tuning element, clutch means connecting said fine tuning shaft to said cam member to rotate the same for VHF fine tuning, a UHF main tuning shaft, said cam member having a radially extending flange portion the periphery of which forms a second cam surface, a cam follower arm connected to said main tuning shaft and biased into engagement with said second cam surface on said cam member, whereby rotation of said fine tuning shaft is effective simultaneously to actuate said fine tuning element and to rotate said main tuning shaft at a relatively slow rate, stop means for limiting rotation of said cam member to less than 360°, and means responsive to movement of said fine tuning shaft after said stop means is reached for driving said main tuning shaft directly at a substantially increased rate.

6. A combined VHF-UHF television tuner comprising, a VHF fine tuning element, a VHF station selector shaft, a fine tuning shaft, a cam member rotatably mounted on said station selector shaft, said cam member having a first cam surface adapted to engage said fine tuning element, clutch means connecting said fine tuning shaft to said cam member to rotate the same for VHF fine tuning, a UHF main tuning shaft, said cam member having a second cam surface, a cam follower arm connected to said main tuning shaft and biased into engagement with said second cam surface on said cam member, whereby rotation of said fine tuning shaft is effective simultaneously to actuate said fine tuning element and to rotate said main tuning shaft at a relatively slow rate, stop means for limiting rotation of said cam member to less than 360°, and means including a gear element rotatably mounted on said fine tuning shaft and responsive to rotation of said fine tuning shaft after said stop means is reached and said clutch means slips for driving said main tuning shaft at a substantially increased rate.

7. A combined VHF-UHF television tuner comprising, a VHF fine tuning element, a VHF station selector shaft, a fine tuning shaft, a cam member rotatably mounted on said station selector shaft, said cam member having a first cam surface adapted to engage said fine tuning element, clutch means connecting said fine tuning shaft to said cam member to rotate the same for VHF fine tuning, a UHF main tuning shaft, said cam member having a second cam surface, a cam follower arm connected to said main tuning shaft and biased into engagement with said second cam surface on said cam member, whereby rotation of said fine tuning shaft is effective simultaneously to actuate said fine tuning element and to rotate said main tuning shaft at a relatively slow rate, stop means for limiting rotation of said cam member to less than 360°, means including a gear element rotatably mounted on said fine tuning shaft and responsive to rotation of said fine tuning shaft after said stop means is reached and said clutch means slips for driving said main tuning shaft at a substantially increased rate, and second clutch means interconnecting said cam follower and said main tuning shaft, said second clutch means being effective to disconnect said cam follower when said main tuning shaft is driven at said increased rate.

8. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less that 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, and lost motion means for interconnecting said disc and said gear element upon continued rotation of said fine tuning shaft after said stop is engaged by said lug on said cam member, thereby to drive said main tuning shaft from said fine tuning shaft through said gear means at a substantially increased rate.

9. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, an indicator sleeve rotatably mounted on said fine tuning shaft, a gear element connected to one end of said sleeve, gear means interconnecting said gear element and said main tuning shaft, and lost motion means for interconnecting said disc and said gear element upon continued rotation of said fine tuning shaft after said stop is engaged by said lug on said cam member, thereby to drive said main tuning shaft from said fine tuning shaft through said gear means at a substantially increased rate.

10. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, an indicator sleeve rotatably mounted on said fine tuning shaft and carrying a first gear element, gear means interconnecting said gear element and said main tuning shaft, means defining an annular recess in the end of said indicator sleeve, means defining a radially inwardly extending dog on the outer wall of said recess, means on said disc and adapted to engage said dog for providing a lost motion connection between said disc and said indicator sleeve, whereby said main tuning shaft is driven from said fine tuning shaft through said gear means at a substantially increased rate.

11. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, lost motion means for interconnecting said disc and said gear element upon continued rotation of said fine tuning shaft after said stop is engaged by said lug on said cam member, thereby to drive said main tuning shaft from said fine tuning shaft through said gear means at a substantially increased rate, and means for holding said cam member, said clutch means, said fine tuning shaft and said indicator sleeve in assembled relation on said station selector shaft.

12. A combined VHF-UHF television tuner, comprising a chassis having a V-shaped bearing surface in each end thereof, a VHF station selector shaft, a torsion bar spring having one end portion biasing said selector shaft against one of said V-shaped bearing surfaces, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, lost motion means for interconnecting said disc and said gear element upon continued rotation of said fine tuning shaft after said stop is engaged by said lug on said cam member, thereby to drive said main tuning shaft from said fine tuning shaft through said gear means at a substantially increased rate, and a retaining bracket having an opening through which said indicator sleeve extends, the other end of said torsion spring engaging said bracket and exerting a side thrust thereon which biases said selector shaft against the other one of said V-shaped bearing surfaces and holds said cam member, said fine tuning shaft and said indicator sleeve in assembled relation on said station selector shaft.

13. A combined VHF-UHF television tuner, comprising a chassis having a pair of end walls, an opening in one of said end walls having a first pair of V-shaped edges, a VHF station selector shaft, a torsion bar spring having one end portion biasing said selector shaft against said first pair of V-shaped edges to provide a bearing therefor, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, lost motion means for interconnecting said disc and said gear element upon continued rotation of said fine tuning shaft after said stop is engaged by said lug on said cam member, thereby to drive said main tuning shaft from said fine tuning shaft through said gear means at a substantially increased rate, means defining an opening having a second pair of V-shaped edges in the other end wall of said chassis, and a retaining bracket having an opening through which said indicator sleeve extends, the other end of said torsion spring engaging said bracket and exerting side thrust on said selector shaft to bias the same against said second pair of V-shaped edges while permitting ready disassembly of said sleeve, said fine tuning shaft and said cam member upon disengagement of said end from said bracket.

14. A combined VHF-UHF television tuner comprising, a VHF fine tuning element, a VHF station selector shaft, a fine tuning shaft, a cam member rotatably mounted on said station selector shaft, said cam member having a first cam surface adapted to engage said fine tuning element, clutch means connecting said fine tuning shaft to said cam member to rotate the same for VHF fine tuning, a UHF main tuning shaft, means for limiting rotation of said main tuning shaft, said cam member having a second cam surface, a cam follower arm connected to said main tuning shaft and biased into engagement with said second cam surface on said cam member, whereby rotation of said fine tuning shaft is effective simultaneously to actuate said fine tuning element and to rotate said main tuning shaft at a relatively slow rate, stop means for limiting rotation of said cam member to less than 360°, means responsive to movement of said fine tuning shaft after said stop means is reached for driving said main tuning shaft directly at a substantially increased rate, and means operative when the limit of rotation of said main tuning shaft is reached for disengaging said disc from said gear element, thereby to prevent damage to said main tuning shaft upon continued rotation of said fine tuning shaft in the same direction.

15. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, means for limiting rotation of said main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, lost motion means for interconnecting said disc and said gear element upon continued rotation of said fine tuning shaft after said stop is engaged by said lug on said cam member, thereby to drive said main tuning shaft from said fine tuning shaft through said gear means at a substantially increased rate, and means operative when the limit of rotation of said main tuning shaft is reached for disengaging said disc from said gear element, thereby to prevent damage to said main tuning shaft upon continued rotation of said fine tuning shaft in the same direction.

16. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, a second disc mounted on said fine tuning shaft between said first named disc and said gear element, means defining a series of mating teeth in the opposed faces of said first and second discs, means normally biasing said discs together so that said mating teeth mesh, and lost motion means for interconnecting said second disc and said gear element upon continued rotation of said fine tuning shaft after said stop is engaged by said lug, thereby to drive said main tuning shaft through said gear means at a substantially increased ratio, said biasing means permitting said discs to slip relative to one another when the limit of rotation of said main tuning shaft is reached.

17. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, a second disc mounted on said fine tuning shaft between said first named disc and said gear element, means defining a series of mating teeth in the opposed faces of said first and second discs, means normally biasing said discs together so that said mating teeth mesh, and lost motion means for interconnecting said second disc and said gear element upon continued rotation of said fine tuning shaft after said stop is engaged by said lug, thereby to drive said main tuning shaft through said gear means at a substantially increased ratio, said mating teeth being arranged to slide over one another against the force of said biasing means when the limit of rotation of said main tuning shaft is reached and a predetermined torque is exerted on said fine tuning shaft.

18. A combined VHF-UHF television tuner, comprising a VHF fine tuning element, a VHF station selector shaft, a fine tuning shaft rotatably mounted on said selector shaft and having a transverse disc connected thereto, a cam member rotatably mounted on said selector shaft between said disc and said fine tuning element, said cam member having an end cam surface adapted to engage said fine tuning element, clutch means interconnecting said disc and said cam member to rotate the same for VHF fine tuning, a lug on said cam member, means defining a positive stop adapted to engage said lug so that rotation of said cam member is limited to less than 360°, a UHF main tuning shaft, said cam member having a peripheral edge portion defining a second cam surface, a cam follower arm, means including second clutch means for connecting said cam follower arm to said main tuning shaft, means biasing the end of said cam follower arm into engagement with said peripheral edge portion of said cam member, whereby rotation of said cam member is effective simultaneously to actuate said fine tuning element and to rotate said main tuning shaft at a relatively slow rate, a first gear element rotatably mounted on said fine tuning shaft, gear means interconnecting said gear element and said main tuning shaft, a second disc mounted on said fine tuning shaft between said first named disc and said gear element, means defining a series of mating teeth in the opposed faces of said first and second discs, means normally biasing said discs together so that said mating teeth mesh, and lost motion means for interconnecting said second disc and said gear element upon continued rotation of said fine tuning shaft after said stop is engaged by said lug, thereby to drive said main tuning shaft through said gear means at a substantially increased ratio, said mating teeth being arranged to provide an audible clicking noise by sliding over one another against the force of said biasing means to provide an indication that the limit of rotation of said main tuning shaft has been reached.

References Cited by the Examiner

UNITED STATES PATENTS

| | | | |
|---|---|---|---|
| 2,756,599 | 7/1956 | Sperber | 74—10.5 |
| 2,853,882 | 9/1958 | Mason | 74—10.5 |

MILTON KAUFMAN, *Primary Examiner.*